United States Patent
Hong et al.

(10) Patent No.: US 9,076,519 B2
(45) Date of Patent: Jul. 7, 2015

(54) RERAM DEVICE STRUCTURE

(75) Inventors: Cheong Min Hong, Austin, TX (US); Feng Zhou, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 429 days.

(21) Appl. No.: 13/563,233

(22) Filed: Jul. 31, 2012

(65) Prior Publication Data

US 2014/0036568 A1  Feb. 6, 2014

(51) Int. Cl.
G11C 11/00 (2006.01)
G11C 13/00 (2006.01)
H01L 45/00 (2006.01)
H01L 27/24 (2006.01)

(52) U.S. Cl.
CPC ............ *G11C 13/0007* (2013.01); *H01L 45/04* (2013.01); *H01L 45/1233* (2013.01); *H01L 45/146* (2013.01); *H01L 45/1633* (2013.01); *H01L 45/1683* (2013.01); *H01L 27/2463* (2013.01)

(58) Field of Classification Search
USPC ............. 365/46, 94, 100, 129, 148, 158, 163; 257/2–5, 9, 295, 310, E21.35; 438/95, 438/96, 135, 166, 240, 365, 482, 486, 597, 438/785
See application file for complete search history.

(56) References Cited

U.S. PATENT DOCUMENTS

| | | | |
|---|---|---|---|
| 2007/0246832 A1 | 10/2007 | Odagawa et al. | |
| 2008/0273370 A1 | 11/2008 | Keller et al. | |
| 2009/0097300 A1 | 4/2009 | Ishihara et al. | |
| 2009/0279343 A1 | 11/2009 | Chang et al. | |
| 2010/0244114 A1 | 9/2010 | Konno et al. | |
| 2011/0044089 A1* | 2/2011 | Goux et al. | 365/148 |
| 2011/0317471 A1 | 12/2011 | Chien et al. | |
| 2012/0261635 A1 | 10/2012 | Zhou et al. | |

OTHER PUBLICATIONS

EP Search Report correlating to 13177826 dated Feb. 10, 2014.
Lee, M.J., et al., "2-stack 1D-1R Cross-point Structure with oxide Diodes as Switch Elements for High Density Resistance RAM Applications", IEEE 2007, pp. 771-774.
Gu, P.Y., et al., "Scalability with silicon nitride encapsulation layer for Ti/HfOx pillar RRAM", IEEE, Jul. 2010, pp. 146-147.
Meyer, R., et al., "Oxide Dual-Layer Memory Element for Scalable Non-Volatile Cross-Point Memory Technology", Non-Volatile Memory Technology Symposium (NVMTS), IEEE, 9th Annual, May 2008, pp. 1-5.
U.S. Appl. No. 13/442,046, Hong, C.M., "RERAM Device Structure", filed Apr. 9, 2012.

* cited by examiner

Primary Examiner — Harry W Byrne (57) ABSTRACT

A resistive random access memory (ReRAM) device can comprise a first metal layer and a first metal-oxide layer on the first metal layer. The first metal-oxide layer comprises the first metal. A second metal layer can comprise a second metal over and in physical contact with the first metal-oxide layer. A first continuous non-conductive barrier layer can be in physical contact with sidewalls of the first metal layer and sidewalls of the first metal-oxide layer. A second metal-oxide layer can be on the second metal layer. The second metal-oxide layer can comprise the second metal layer. A third metal layer can be over and in physical contact with the second metal-oxide layer. The first and second metal-oxide layers, are further characterized as independent storage mediums.

9 Claims, 5 Drawing Sheets

RERAM DEVICE STRUCTURE

BACKGROUND

1. Field

This disclosure relates generally to non-volatile memories (NVMs), and more specifically, to resistive random access memories (ReRAMs).

2. Related Art

The development of resistive random access memories is promising due to features that offer many advantages. ReRAM cells have a dielectric that can, using electrical means, be made to have conductive filaments that establish a low resistance state. The process can be reversed whereby filaments are broken raising the resistance to a higher resistance state. One consideration with any semiconductor memory device is data density available in a given space or size of device.

With respect to a resistive RAM (ReRAM) device, the states of the resistive RAM device depend on the resistance of the device. For example, a higher resistance may correspond to a first state and a lower resistance may correspond to a second state. Tight resistance distribution is necessary to achieve multilevel storage capability which can significantly increase the data density. Therefore, it is desirable to improve control over the resistance distribution and to improve data retention for resistive RAM devices.

A further consideration with ReRAM in particular is the ability to achieve a consistent level of resistance for programming and erasing the memory cells.

Also, always a consideration is the ease with which any solution can be implemented. Since it is a different type of technology than normal semiconductor technology, the use of established techniques can be difficult in achieving a desired result for ReRAMs.

Accordingly there is a need for an ReRAM and a method of making the ReRAM that takes into account the considerations listed above.

BRIEF DESCRIPTION OF THE DRAWINGS

Embodiments of the present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of devices and methods are disclosed for ReRAM configurations that provide multibit storage capability with more than two states per memory cell. The multibit capability increases memory capacity without appreciably increasing the footprint of each memory cell. The memory device includes multiple copper/copper oxide layers formed in trenches in layers of dielectric material. The copper layers serve as electrodes and the copper oxide layers serve as a storage medium between the copper layers. Silicon nitride spacers can be used to protect sidewalls of the trenches. Also, the process steps, individually, are established back end of line techniques that can be readily implemented without requiring additional equipment or new process steps. This is better understood by reference to the following description and the figures.

Figure 1:
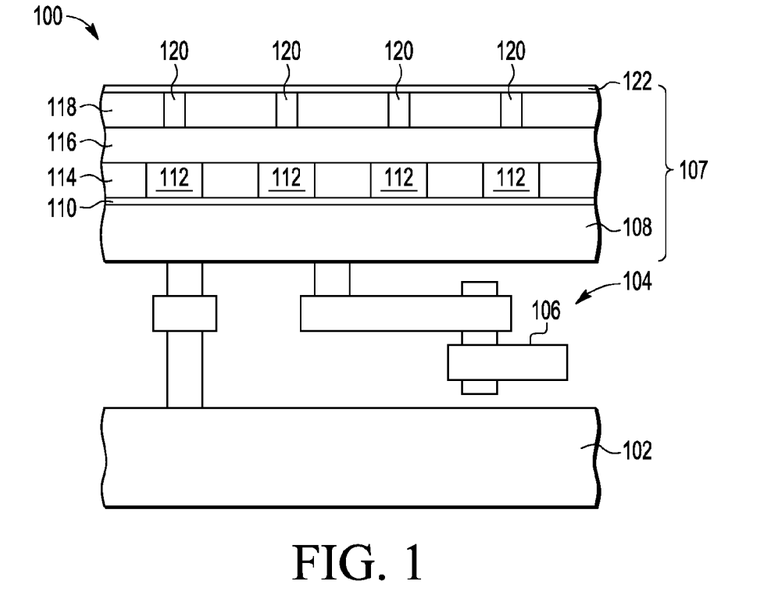
FIG. 1 is a cross-sectional view of an embodiment of a memory device in accordance with the present invention.

FIG. 1 is a cross-sectional view of an embodiment of a semiconductor device 100 in accordance with the present invention that includes a semiconductor wafer 102, one or more layers 104 of interconnects 106 between integrated circuitry (not shown) on wafer 102 and resistive random access memory device 107. The embodiment of memory device 107 shown includes, in order from bottom to top, a substrate 108, conductive layer 110, inter-layer dielectric (ILD) layer 114 including first set of memory cells 112, copper/copper oxide layers 116, inter-layer dielectric layer 118, second set of memory cells 120, and conductive layer 122. Memory device 107 can be referred to as a ReRAM device.

Substrate 108 can be any semiconductor or non-semiconductor material or combinations of material, such as gallium arsenide, silicon germanium, silicon-on-insulator (SOI), silicon, silicon nitride, inter-layer dielectric, monocrystalline silicon, glass, plastic, the like, and combinations of the above.

Figure 2:
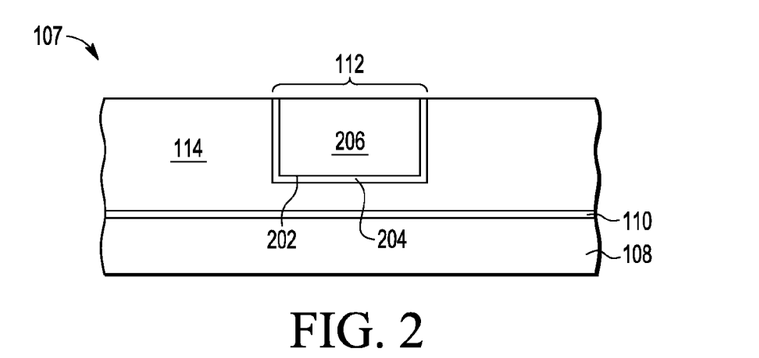
FIG. 2 is a cross-sectional view of the memory device of FIG. 1 at an intermediate stage in manufacture.

With reference to FIG. 2, further detail of a portion of memory device 107 of FIG. 1 during an intermediate stage of manufacture is shown with memory cell 112 including a trench 202 formed using conventional techniques in ILD layer 114. Trench 202 can be approximately 500 to 1000 Angstroms wide and 1000 to 2000 Angstroms high, or other suitable dimensions. The length of trench 202 can run the entire diameter or length of substrate 108. ILD layer 114 can be formed of oxide, nitride, oxynitride, or other suitable material and etched using photolithography or other suitable technique.

Continuous non-conductive barrier layer 204 is then formed in physical contact with the sidewalls and bottom of trench 202. Non-conductive barrier layer 204 may be a nitride material, such as silicon nitride, or other suitable material, that provides an effective barrier to diffusion of a conductive metal such as copper. Non-conductive barrier layer 204 may be formed using chemical vapor deposition to a thickness of about 100 to 200 Angstroms. Other suitable forming techniques and thicknesses for non-conductive barrier layer 204 can be used.

Trench 202 is then filled with a conductive material 206 such as copper. For example, conductive material 206 may be deposited to a height of 5000 to 8000 Angstroms or other suitable height. Conductive material 206 extending above trench 202 may then be removed, such as by performing chemical-mechanical polishing or other suitable technique so that the top surface of conductive material 206 and non-conductive barrier layer 204 is flush or substantially planar with the top of ILD layer 114.

Figure 3:
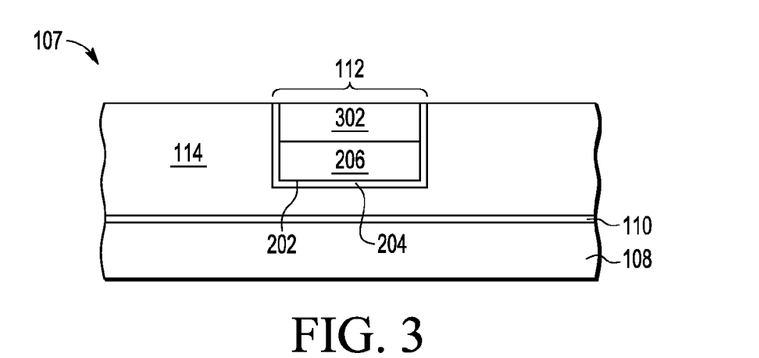
FIG. 3 is a cross-sectional view of the memory device of FIG. 2 at a subsequent stage in manufacture.

FIG. 3 is a cross-sectional view of the memory device of FIG. 2 at a subsequent stage in manufacture after performing an oxidation process to form an oxide layer 302 from the top portion of conductive material 206 remaining in trench 202 after the planarizing step. Oxide layer 302 is copper oxide for the case where conductive material 206 is copper. Oxidation step may include application of oxygen as $O_2$. Other techniques for forming an oxide of conductive material 206 may also be used. The speed of oxide formation is relative to the temperature at which the process is formed. For example, temperatures used during the oxidation process may range from 400 to 500 degrees Celsius. The height of oxide layer 302 may range from approximately 500 to 1000 Angstroms, that is, approximately half the height of conductive material 206 before the oxidation process. Thus, the optimization of the thickness of oxide layer 302, the speed of deposition, and the effect on underlying circuitry may need to be balanced. Oxide layer 302, which is where conductive filaments are formed and broken, may also be referenced as storage medium 302. Conductive material 206 and oxide layer 302 are in contact with each other and non-conductive barrier layer 204.

Figure 4:
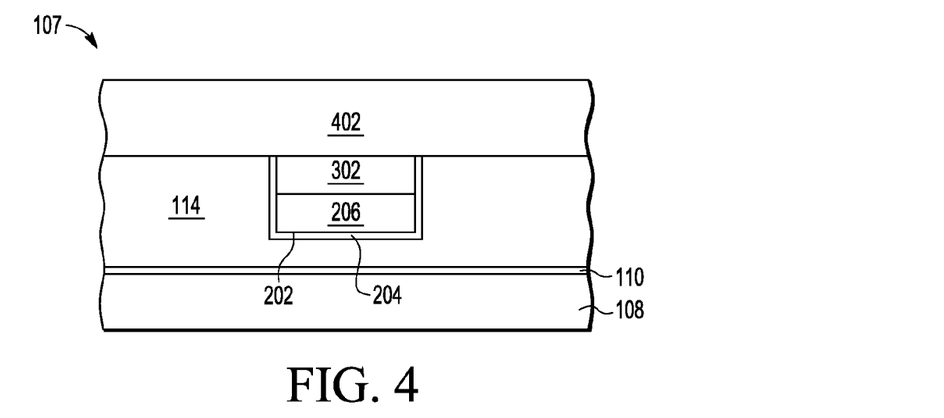
FIG. 4 is a cross-sectional view of the memory device of FIG. 3 at a subsequent stage in manufacture.

FIG. 4 is a cross-sectional view of the memory device of FIG. 3 at a subsequent stage in manufacture in which a second inter-layer dielectric (ILD) layer 402 is formed at a height of 1000 to 2000 Angstroms or other suitable height. ILD layer 402 is then etched to form one or more trenches (not shown) along the length of substrate 108. The trench(es) in ILD layer 402 are substantially perpendicular lengthwise to the trench 202 formed for conductive layer 206 (FIG. 2). The trench(es) can be approximately 500 to 1000 Angstroms wide and 1000 to 2000 Angstroms high, or other suitable dimensions. ILD layer 402 can be formed of oxide, nitride, oxynitride, or other suitable material and etched using photolithography or other suitable technique.

Figure 5:
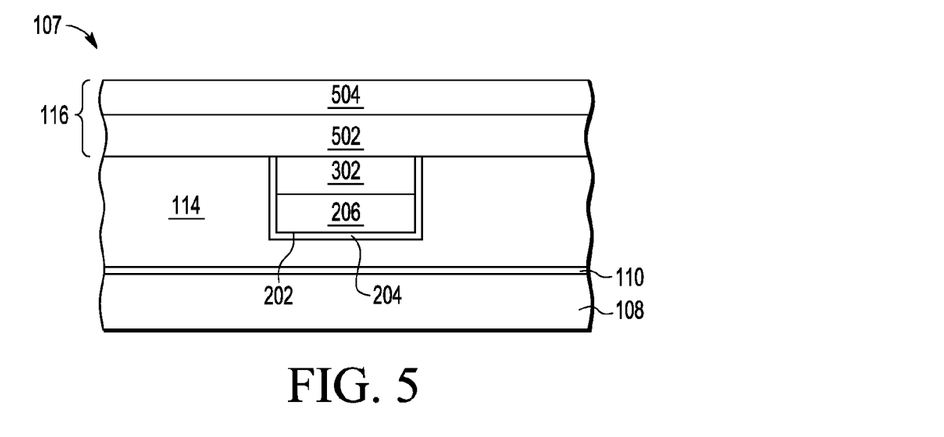
FIG. 5 is a cross-sectional view of the memory device of FIG. 4 at a subsequent stage in manufacture.

FIG. 5 is a cross-sectional view of the memory device of FIG. 4 at a subsequent stage in manufacture after depositing another conductive layer 502 over the top of and in physical contact with oxide layer 302 and ILD layer 114. For example, conductive material 502 may be deposited to a height of 5000 to 8000 Angstroms or other suitable height. Conductive material 502 extending above ILD 402 (FIG. 4) may then be removed, such as by performing chemical-mechanical polishing or other suitable technique so that the top surface of conductive material 502 is flush or substantially planar with the top of ILD layer 402.

Another oxidation process is performed to form an oxide layer 504 from the top portion of conductive material 502 remaining in the trench after the planarizing step. Oxide layer 504 is copper oxide for the case where conductive material 502 is copper. Oxidation step may include application of oxygen as $O_2$ at temperatures ranging from 400 to 500 degrees Celsius. Other techniques for forming an oxide of conductive material 504 may also be used. The height of oxide layer 504 may range from approximately 500 to 1000 Angstroms, that is, approximately half the height of conductive material 502 before the oxidation process. Oxide layer 504, which is where conductive filaments are formed and broken, may also be referenced as storage medium 504. Conductive material 502 and oxide layer 504 are in contact with each other, but oxide layer 504 is not in direct contact with oxide layer 302.

Figure 6:
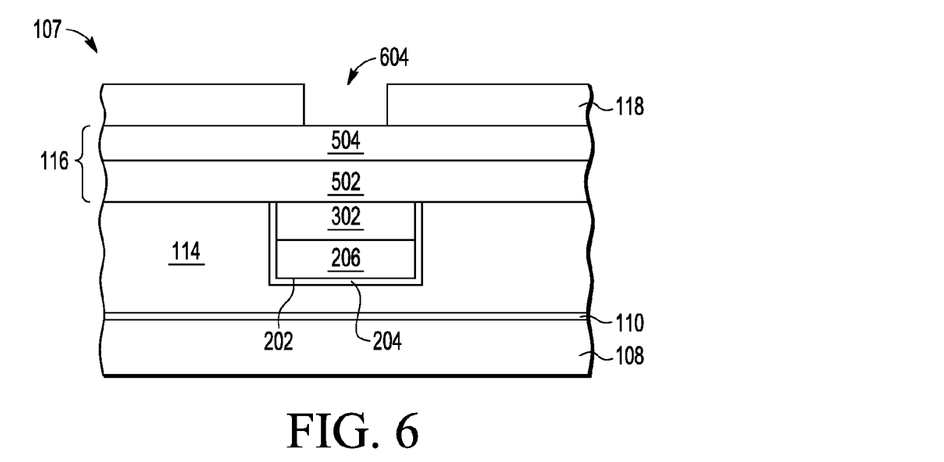
FIG. 6 is a cross-sectional view of the memory device of FIG. 5 at a subsequent stage in manufacture.

FIG. 6 is a cross-sectional view of the memory device of FIG. 5 at a subsequent stage in manufacture in which inter-layer dielectric layer 118 is formed at a height of 1000 to 2000 Angstroms over and in contact with oxide layer 504. ILD layer 118 is then etched to form one or more trenches 604. The trench(es) 604 in ILD layer 118 are oriented lengthwise in the same direction as trench 202 (FIG. 2) and lengthwise perpendicular to the trench(e)s formed for conductive layer 502 and oxide layer 504. The center of trench 604 is vertically aligned with the center of conductive layer 206/oxide layer 302. The trench(es) 604 can be approximately 800 to 1800 Angstroms wide and 1000 to 2000 Angstroms high, or other suitable dimensions. ILD layer 402 can be formed of oxide, nitride, oxynitride, or other suitable material and etched using photolithography or other suitable technique.

Figure 7:
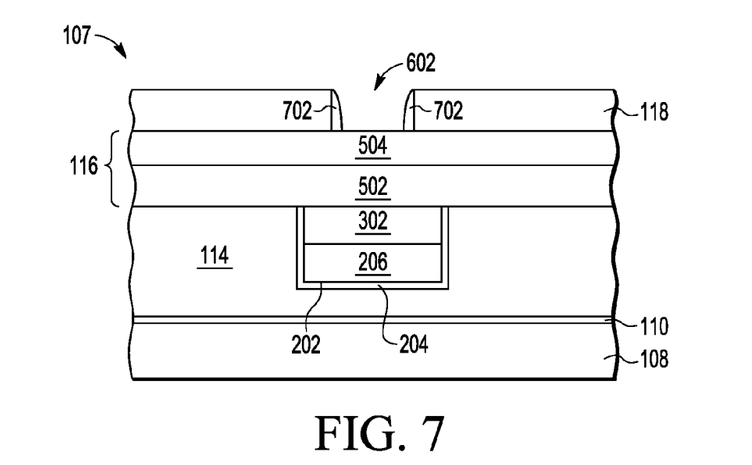
FIG. 7 is a cross-sectional view of the memory device of FIG. 6 at a subsequent stage in manufacture.

FIG. 7 is a cross-sectional view of the memory device of FIG. 6 at a subsequent stage in manufacture after forming spacer 702 in contact with sidewalls of trench 602. In some embodiments, spacer 702 may be formed by depositing a conformal layer and performing an anisotropic etch back of the conformal layer. Spacer 702 can be formed of a nitride composition that includes silicon, carbon, and nitrogen. Other suitable materials and forming techniques can be used for spacer 702.

Figure 8:
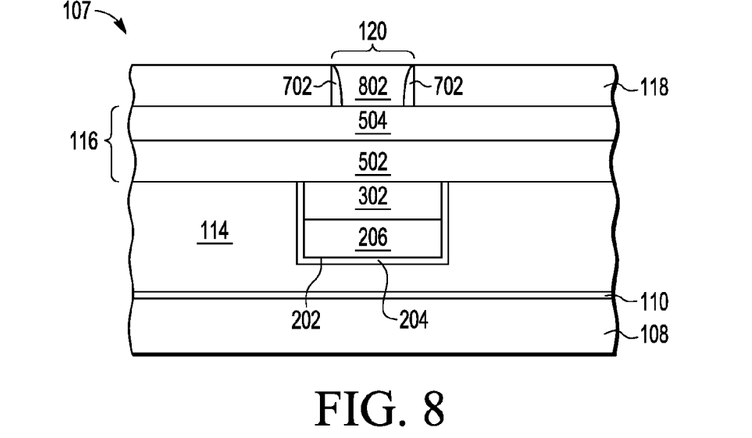
FIG. 8 is a cross-sectional view of the memory device of FIG. 7 at a subsequent stage in manufacture.

FIG. 8 is a cross-sectional view of the memory device of FIG. 7 at a subsequent stage in manufacture after which conductive material 802 such as copper is deposited in trench 602 (FIG. 6). Conductive material 802 may initially be deposited to a height of above trench 802 and any conductive material 802 extending above ILD 118 may then be removed, such as by performing chemical-mechanical polishing or other suitable technique so that the top surface of conductive material 802 is flush or substantially planar with the top of ILD layer 118.

Note that by growing oxide layers 302, 504 directly on conductive layers 206, 502, an improved interface between the two layers is provided in which reduced defects are present as compared to interfaces formed by the deposition of layers. Also, since copper is a good oxygen absorber, conductive layers 206, 502 absorb random atomic or dangling oxygen, resulting in oxide layers 302, 504 being more uniform. This increased uniformity resulting from the absorption of oxygen may allow, for example, for a tighter resistance distribution. That is, since dangling oxygen is absorbed from the interfaces between oxide layers 302, 504 and conductive layers 206, 502, filaments 1202, 1204, 1302-1310 may be more uniformly created. Furthermore, barrier layer 204 and spacer 702 may function as a copper migration barrier. Also, barrier layer 204 and spacer 702 may reduce movement of oxygen vacancies into and/or out of oxide layers 302, 504. In addition, barrier layer 204 and spacer 702 may reduce edge effects on the sidewall of oxide layers 302, 504. For example, barrier layer 204 and spacer 702 may function as a barrier to forming ruptures on the sidewall of oxide layers 302, 504. In this manner, by reducing edge effects, formation of filaments 1202, 1204, 1302-1310 may be more confined within oxide layers 302, 504, away from the sidewalls of oxide layers 302, 504.

Figure 9:
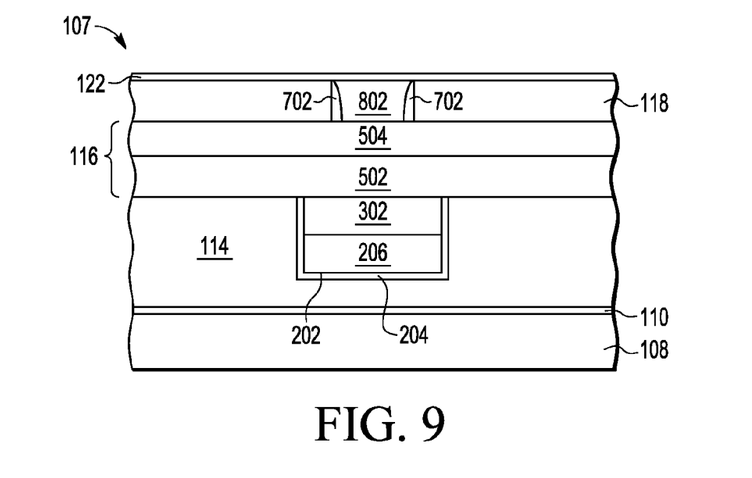
FIG. 9 is a cross sectional view of the memory device of FIG. 8 at a subsequent stage in manufacture.

FIG. 9 is a cross sectional view of the memory device of FIG. 8 at a subsequent stage in manufacture after a thin ILD layer 122 is deposited over the top of ILD 118 and conductive material 802. ILD layer 122 provides a passivation layer over the exposed conductive material 802 to avoid oxidation or contamination of the exposed material 802 during subsequent process steps or during storage. The passivation ILD layer 122 is a material such as silicon nitride chosen for good adhesion between the ILD layer 122 and the exposed conductive material 802 as well as for the ability to protect the conductive material 802 from oxygen or other elements which will degrade the surface of conductive material 802. ILD layer 122 can have a thickness of between about 200 and 500 Angstroms or other suitable thickness.

Figure 10:
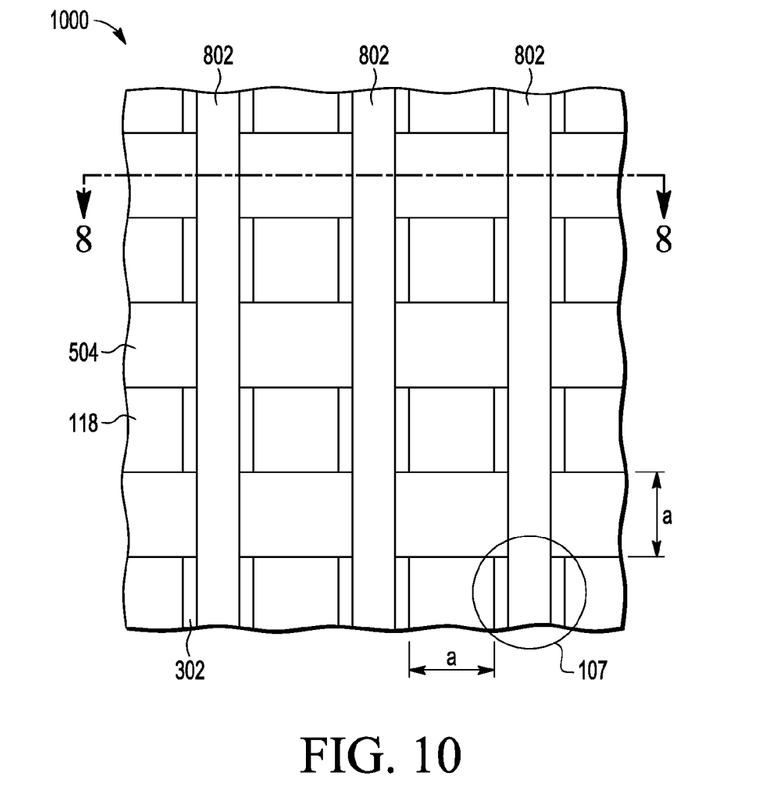
FIG. 10 is a top view of the memory device of FIG. 8.

FIG. 10 is a top view of the memory device 107 of FIG. 8 showing a portion of an array 1000 of multi-bit memory devices 107 with rows of conductive material 802 over and perpendicular to rows of oxide layer 504. The rows of oxide layer 504 are over and perpendicular to segmented rows of oxide layer 302. Memory devices 1002 can be spaced approximately 1000 Angstroms or other suitable dimension from each other in the x and y directions. It is also anticipated that two or more stacks of arrays 1000 can be formed in the vertical (z) direction.

FIGS. 11-14 illustrate, in diagrammatic form, different resistive states of resistive RAM cell, such as memory device 107, in accordance with an embodiment of the present invention. Oxide layers 302, 504 form the conductive medium of memory device 107, located between conductive layers 206, 502, 802. During the initial state, no filaments are present in oxide layers 302, 504. During the forming process, filaments 1202, 1204, and/or 1302-1310 (see FIGS. 12 and 13) are initially formed within oxide layers 302, 504. This forming of filaments 1202, 1204, 1302-1310 is typically performed only once for memory device 107. That is, the forming process is formed on fresh devices that have not yet been operated.

Once the forming process is completed, a memory device 107 will not need the forming process again. For the forming process, voltages are applied to result in a current through two or three current electrodes (i.e., conductive layers 206, 502, 802) of memory device 107. Depending on which conductive layers receive the current, the current forms filaments 1202, 1204, and/or 1302-1310 which are formed of mobile ions or oxygen vacancies within the oxide layers 302, 504. The filaments 1202, 1204, 1302-1310 reduce the resistance of oxide layers 302, 504.

Figure 11:
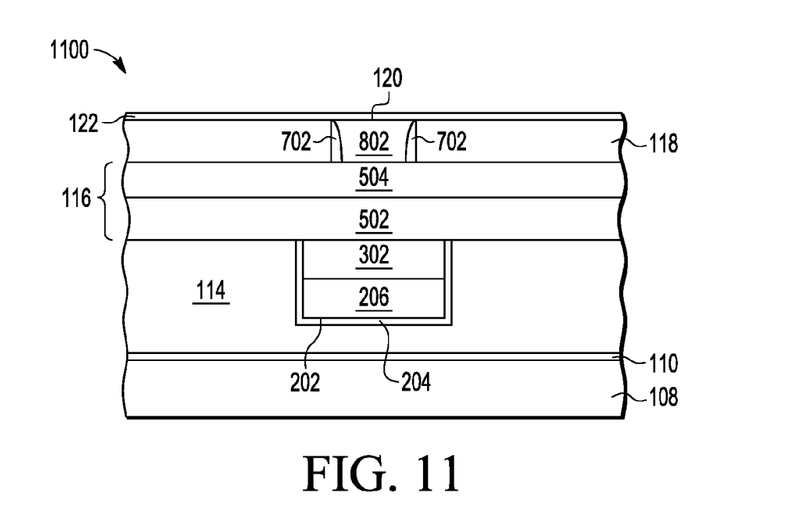
FIG. 11 is a cross-sectional view of the memory device of FIG. 9 in a high resistive state.
Figure 12:
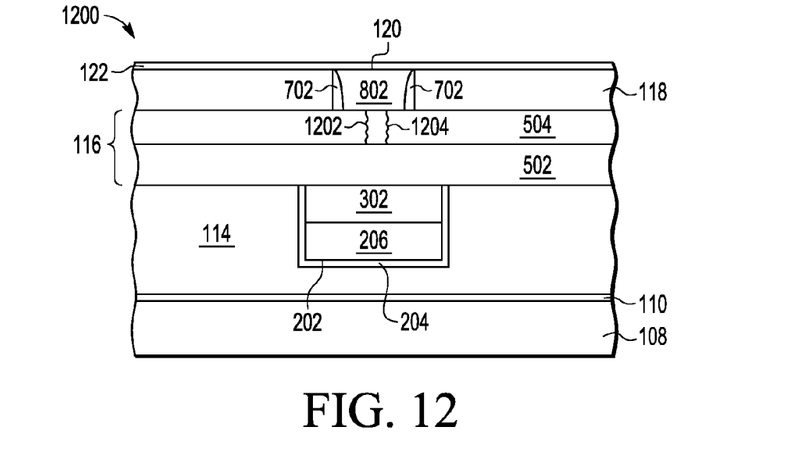
FIG. 12 is a cross-sectional view of the memory device of FIG. 9 in a third lowest resistive state.
Figure 13:
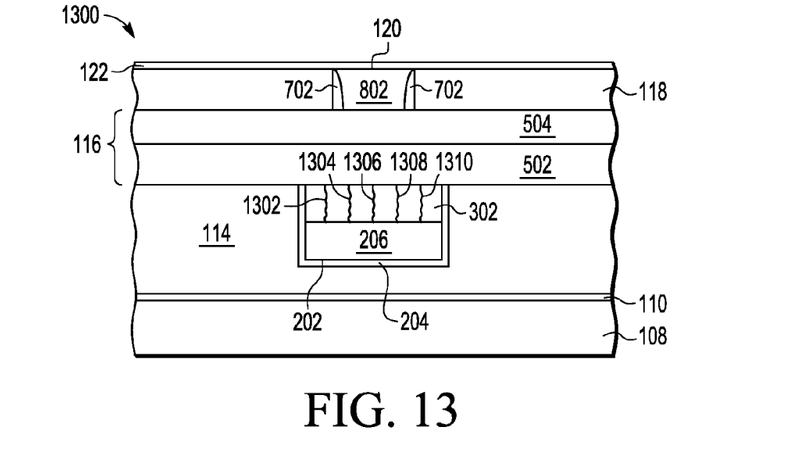
FIG. 13 is a cross-sectional view of the memory device of FIG. 9 in a second lowest resistive state.
Figure 14:
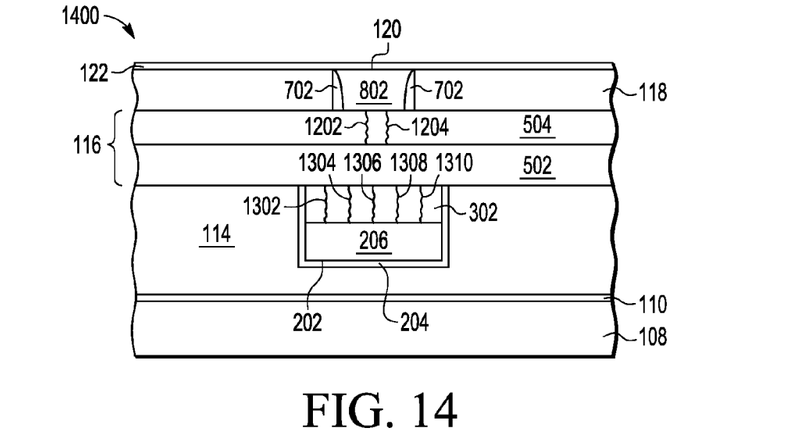
FIG. 14 is a cross-sectional view of the memory device of FIG. 9 in a lowest resistive state.

FIGS. 11-14 illustrate in diagram form an example of how memory device 107 may be used as a multi-bit memory device. FIG. 11 is a cross-sectional view of the memory device 107 in a high resistive state 1100 in which no filaments have been formed in oxide layers 302 or 504. FIG. 12 is a cross-sectional view of the memory device 107 in a third lowest resistive state 1200 in which filaments 1202, 1204 have been formed in oxide layer 504, but no filaments in oxide layer 302. FIG. 13 is a cross-sectional view of the memory device 107 in a second lowest resistive state 1300 in which filaments 1302-1310 have been formed in oxide layer 302, and no filaments in oxide layer 504. FIG. 14 is a cross-sectional view of the memory device of FIG. 9 in a lowest resistive state 1400 in which filaments 1202-1204 and 1302-1310 have been formed in respective oxide layers 302, 504. Note that a greater number of filaments 1302-1310 have been formed in oxide layer 302 compared to the number of filaments 1202-1204 formed in oxide layer 502. The difference in number of filaments creates different levels of resistance, which may be sensed to determine which of the four states memory device 107 is in. Additionally, since memory device 107 is capable of being programmed in up to four different states, memory device 107 can be used to store two bits of information.

Once filaments 1202, 1204, 1302-1310 are formed, memory device 107 can be set and reset as needed to change the state of the memory device 107.

During the reset process, voltages are applied to result in a current which causes one or more ruptures in filaments 1202, 1204, and/or 1302-1310, again depending on which conductive layers receive the current. This causes the resistance of oxide layers 302 and/or 504 to increase, in which the increased resistance may correspond to first, second, third or fourth states of memory device 107. During the set process, voltages are applied to result in a current which recovers filaments 1202, 1204, and/or 1302-1310 by restoring continuity to the ruptures created during the reset. The recovery of filaments 1202, 1204, and/or 1302-1310 causes the resistance of respective oxide layers 302 and/or 504 to decrease, in which the decreased resistance may correspond to another one of the four possible states of memory device 107.

To differentiate between states, the resistance levels achieved by forming filaments 1202-1204 and 1302-1310 can be controlled. In some embodiments, the thickness of oxide layer 302 can be different than the thickness of oxide layer 504 to achieve different levels of resistance. For example, oxide layer 504 can be 250 to 500 Angstroms thick while oxide layer 302 can be 500 to 1000 angstroms thick. Other thicknesses can be used. As another example, the area of conductive layer 802 can be different than the area of conductive layer 206. As another example, the width of conductive layer 502 can be varied to control the number of filaments formed in oxide layers 302, 504. As a still further example, different voltages can be used to form filaments in oxide layers 302, 504, thus resulting in different numbers of filaments being formed between oxide layer 302 and oxide layer 504.

By now it should be appreciated that a resistive random access memory (ReRAM) device 107 can comprise a first metal layer 206 and a first metal-oxide layer 302 on the first metal layer 206. The first metal-oxide layer 302 comprises the first metal 206. A second metal layer 502 can comprise a second metal 502 over and in physical contact with the first metal-oxide layer 302. A first continuous non-conductive barrier layer 204 can be in physical contact with sidewalls of the first metal layer 206 and sidewalls of the first metal-oxide layer 302. A second metal-oxide layer 504 can be on the second metal layer 502. The second metal-oxide layer can comprise the second metal layer 502. A third metal layer 802 can be over and in physical contact with the second metal-oxide layer 504. The first and second metal-oxide layers 302, 504 are further characterized as independent storage mediums.

In another aspect, the ReRAM device 107 can further comprise a non-conductive spacer 702 in physical contact with sidewalls of the third metal layer 802 and electrically isolated from the first continuous non-conductive barrier layer 204.

In another aspect, the non-conductive spacer 702 extends from the top of the third metal layer 802 to the top of the second metal-oxide layer 504.

In another aspect, the ReRAM device 107 can further comprise a first dielectric layer 114 surrounding the first continuous non-conductive barrier layer 204. The first continuous non-conductive barrier layer 204 is between the first dielectric layer 114 and the sidewalls of the first metal layer 206 and the first metal-oxide layer 302. A second dielectric layer 118 surrounds the non-conductive spacer 702. The non-conductive spacer 702 is between the second dielectric layer 118 and the sidewalls of the third metal layer 802.

In another aspect, the third metal layer 802 is located within a perimeter of a first major surface of the first metal-oxide layer 302.

In another aspect, the first continuous non-conductive barrier layer 204 extends under the first metal layer 206.

In another aspect, the first, second, and third metal layers 206, 502, 802 comprise copper, and the first and second metal-oxide layers 302, 504 comprise copper oxide.

In another aspect, the first continuous non-conductive barrier layer 204 and the non-conductive spacer 702 comprise at least one of the group consisting of: oxide, nitride, and oxynitride.

In another aspect, a thickness of the first metal-oxide layers 302 is different than a thickness of the second metal-oxide layers 504.

In another embodiment, a method of operating a resistive random access memory (ReRAM), can comprise forming conductive filaments 1302-1310 in the first metal-oxide layer by applying a first voltage to the first metal layer 206 and at least one of the second and the third metal layers 502, 802; and forming conductive filaments 1202-1204 in the second metal-oxide layer 504 by applying a second voltage to the third metal layer 802 and at least one of the first and second metal layers 206, 502. The ReRAM device can include a first metal layer 206 comprising a first metal and a first metal-oxide layer 302 on the first metal layer. The first metal-oxide layer can comprise the first metal. A second metal layer 502 can comprise a second metal and a second metal-oxide layer 504 on the second metal layer. The second metal-oxide layer comprises the second metal. A third metal layer 802 is over the second metal-oxide layer and within a perimeter of a first major surface of the first metal-oxide layer. A first continuous non-conductive barrier layer 204 is in physical contact with sidewalls of the first metal layer and of the first metal-oxide layer. A spacer 702 is in physical contact with sidewalls of the third metal layer. The spacer is within the perimeter of the first major surface of the first metal-oxide layer and is physically separated from the first continuous non-conductive barrier layer.

In another aspect, the method can further comprise sensing a resistive state of the first metal-oxide layer 302 by applying one of a voltage and a current to the first metal layer 206 and at least one of the second and third metal layers 502, 802, and sensing a resistive state of the second metal-oxide layer 504 by applying one of a voltage and a current to the third metal layer 802 and at least one of the first and second metal layers 206, 502.

In another aspect, the method can further comprise sensing a resistive state of the first and second metal-oxide layers 302, 504 by applying one of a voltage and a current to the first metal layer 206 and the third metal layer 802.

In another aspect, the method can further comprise resetting at least some of the conductive filaments 1302-1310 in the first metal-oxide layer 302 by applying a third voltage to the first metal layer 206 and at least one of the second and the third metal layers 502, 802; and resetting at least some of the conductive filaments 1202-1204 in the second metal-oxide layer 504 by applying a fourth voltage to the third metal layer 802 and at least one of the first and second metal layers 206, 502. A magnitude of the third and fourth voltages is lower than a magnitude of the first and second voltages.

In another aspect, the method can further comprise setting at least some of the conductive filaments 1302-1310 in the first metal-oxide layer 302 by applying a fifth voltage to the first metal layer 206 and at least one of the second and the third metal layers 502, 802; and setting at least some of the conductive filaments 1202-1204 in the second metal-oxide layer 504 by applying a sixth voltage to the third metal layer 802 and at least one of the first and second metal layers 206, 502. A magnitude of the fifth and sixth voltages is lower than a magnitude of the first and second voltages.

In another embodiment, a method of forming a resistive random access memory ReRAM can comprise forming an opening 202 in a first dielectric layer 114, and forming a continuous barrier layer 204 within the opening. The continuous barrier layer is in physical contact with a sidewall of the opening and a bottom of the opening. A first metal layer 206 can be formed within the opening. A top portion of the first metal layer is oxidized to form a first metal-oxide layer 302 within the opening. The continuous barrier layer within the opening is in physical contact with sidewalls of the first metal-oxide layer and the first metal layer. A second dielectric layer 402 is formed. An opening is formed in the second dielectric layer. A second metal layer 502 is formed in the opening in the second dielectric layer 304. A length of the second metal layer extends beyond a width of the continuous barrier layer 204. A top portion of the second metal layer is oxidized to form a second metal-oxide layer 504. A third metal layer 802 is formed over the second metal-oxide layer 504.

In another aspect, a width of the third metal layer 802 is different than a width of the first metal layer 206.

In another aspect, the step of forming the third metal layer 802 over the second metal-oxide layer 504 comprises forming a third dielectric layer 118 over the second metal-oxide layer 504, forming an opening in the third dielectric layer which exposes the second metal-oxide layer, forming a barrier layer 702 in physical contact with sidewalls of the opening in the third dielectric layer 118, and forming the third metal layer 802 within the opening in the third dielectric layer 602 and in physical contact with the barrier layer 702.

In another aspect, a thickness of the first metal-oxide layer 302 is different than a thickness of the second metal-oxide layer 504.

In another aspect, the forming of the second metal layer 502 is performed such that the second metal layer 502 is in physical contact with the exposed first metal-oxide layer 302, and the forming of the third metal layer 802 is performed such that the third metal layer 802 is in physical contact with the exposed second metal-oxide layer 504.

In another aspect, each of the first and second continuous barrier layers 204, 702 comprise nitride, the first, second and third metal layers 206, 502, 802 comprise copper, and the first and second metal-oxide layers 302, 504 comprise copper oxide.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, some layers may be a stack of layers. For example, dielectric layers 12 and 24 may be made up of several different dielectric layers. Also additional layers may be present, such as an additional diffusion barrier, between conductive layer 16 and sidewall 15. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A resistive random access memory (ReRAM) device, comprising:
   a first metal layer comprising a first metal;
   a first metal-oxide layer on the first metal layer, wherein the first metal-oxide layer comprises the first metal;
   a second metal layer comprising a second metal over and in physical contact with the first metal-oxide layer;
   a first continuous non-conductive barrier layer in physical contact with sidewalls of the first metal layer and sidewalls of the first metal-oxide layer;
   a second metal-oxide layer on the second metal layer, wherein the second metal-oxide layer comprises the second metal; and
   a third metal layer over and in physical contact with the second metal-oxide layer,
   wherein the first and second metal-oxide layers, are further characterized as independent storage mediums.

2. The ReRAM device of claim 1, further comprising:
   a non-conductive spacer in physical contact with sidewalls of the third metal layer and electrically isolated from the first continuous non-conductive barrier layer.

3. The ReRAM device of claim 2, wherein the non-conductive spacer extends from the top of the third metal layer to the top of the second metal-oxide layer.

4. The ReRAM device of claim 2, further comprising:
   a first dielectric layer surrounding the first continuous non-conductive barrier layer, wherein the first continuous non-conductive barrier layer is between the first dielectric layer and the sidewalls of the first metal layer and the first metal-oxide layer; and
   a second dielectric layer surrounding the non-conductive spacer, wherein the non-conductive spacer is between the second dielectric layer and the sidewalls of the third metal layer.

5. The ReRAM device of claim 1, wherein the third metal layer is located within a perimeter of a first major surface of the first metal-oxide layer.

6. The ReRAM device of claim 1, wherein the first continuous non-conductive barrier layer extends under the first metal layer.

7. The ReRAM device of claim 1, wherein the first, second, and third metal layers comprise copper, and the first and second metal-oxide layers, comprise copper oxide.

8. The ReRAM device of claim 1, wherein the first continuous non-conductive barrier layer and the non-conductive spacer comprise at least one of the group consisting of: oxide, nitride, and oxynitride.

9. The ReRAM device of claim 1, wherein a thickness of the first metal-oxide layers is different than a thickness of the second metal-oxide layers.

\* \* \* \* \*